(12) United States Patent
Imondi et al.

(10) Patent No.: US 7,363,452 B2
(45) Date of Patent: Apr. 22, 2008

(54) PIPELINED BURST MEMORY ACCESS

(75) Inventors: Giuliano Gennaro Imondi, Rieti (IT); Maurizio Di Zenzo, Avezzano (IT); Mario Antonio Fazio, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/343,818

(22) Filed: Jan. 31, 2006

(65) Prior Publication Data

US 2006/0126411 A1 Jun. 15, 2006

Related U.S. Application Data

(63) Continuation of application No. 10/366,213, filed on Feb. 13, 2003, now Pat. No. 7,020,737.

(51) Int. Cl.
*G06F 12/00* (2006.01)

(52) U.S. Cl. .......................................... 711/168; 711/5

(58) Field of Classification Search ................... None
See application file for complete search history.

(56) References Cited

U.S. PATENT DOCUMENTS

| | | | |
|---|---|---|---|
| 5,781,918 A | 7/1998 | Lieberman | |
| 6,111,810 A | 8/2000 | Fujita | |
| 6,230,245 B1 | 5/2001 | Manning | |
| 6,412,048 B1 * | 6/2002 | Chauvel et al. | 711/158 |
| 6,477,621 B1 | 11/2002 | Lee | |
| 7,020,737 B2 * | 3/2006 | Imondi et al. | 711/5 |
| 2002/0194441 A1 * | 12/2002 | Chauvel et al. | 711/158 |
| 2003/0088742 A1 | 5/2003 | Lee | |
| 2006/0126411 A1 * | 6/2006 | Imondi et al. | 365/200 |

* cited by examiner

*Primary Examiner*—Brian R. Peugh
(74) *Attorney, Agent, or Firm*—Leffert Jay & Polglaze, P.A.

(57) ABSTRACT

A memory device for multichannel continuous or fixed burst mode operation includes multiple burst address counter circuits and associated control logic to minimize latency which would otherwise occur in multichannel operation.

28 Claims, 3 Drawing Sheets

PIPELINED BURST MEMORY ACCESS

RELATED APPLICATIONS

This application is a Continuation of U.S. patent application Ser. No. 10/366,213, filed Feb. 13, 2003 now U.S. Pat. No. 7,020,737 and titled, "Pipelined Burst Memory Access," which is commonly assigned and incorporated by reference herein in its entirety. This application claims priority to Italian Patent Application Serial No. RM2002A000281, filed May 20, 2002, entitled "Pipelined Burst Memory Access," which is commonly assigned.

TECHNICAL FIELD

The present invention relates in general to a method and apparatus for rapid read access of a memory device and in particular to a method and apparatus for efficient management of a plurality of data streams read from a nonvolatile memory in fixed length and/or continuous burst mode.

BACKGROUND

Reading data from a memory may be accomplished in a variety of ways. One possible way, used particularly in flash memories, is burst memory access. Burst memory access involves reading either a fixed number of bytes (words) (for example, 4 or 8) from memory or, alternatively, reading a continuous stream of bytes in sequence without interruption beginning from a starting address. The reading of the burst data is very fast because the data has been previously fetched from the memory and put into a buffer.

The concept of burst memory access is based on the assumption that a microprocessor, or other user, will very likely need additional bytes at addresses following a starting address after reading the first byte at the starting address. Thus, when the user requests data from a starting address, a memory in burst mode will fill its buffer with some additional data from other addresses according to a predefined burst mode address sequence or pattern (which may be ascending, descending, aligned or linear, for example) and according to a burst address space size, without waiting to be asked for the next byte. The memory then applies the burst address to a memory array to access data at each burst address location. This additional data will then be immediately available to the user without needing to fetch each word from memory. Burst reading is widely used in many memory architectures, as opposed to other types of synchronous accesses, because it is fast and consumes less power.

Increasingly, in memory applications, burst data may come from two or more channels, each containing different types of information. For example, one channel may be an MP3 data stream (Or other popular audio compression format) from a first starting address, and a second channel may be code to be executed by a microprocessor from a second starting address. Since generally there is only one system bus, and one mechanism for burst mode filling of a memory buffer, it is necessary to switch from one channel to the other and delays inevitably result.

The delays result because new burst data is not available immediately when the request for new data from a new starting address is made. When the starting address changes, the memory needs time to fetch new data and load it into the memory buffer. This time is called "latency" and is normally expressed in terms of a number of synchronous clock cycles.

Latency problems may occur in a memory chip supporting burst read because there is only one burst state machine (BSM) employed to control the burst operations. The BSM's primary job is to provide subsequent addresses to the memory once the starting address has been given. Since there is only one BSM, it is not possible to operate in burst mode simultaneously for more than one channel.

For the reasons stated above and for additional reasons stated hereinafter, which will become apparent to those skilled in the art upon reading and understanding the present specification, there is a need in the art for a multichannel pipelined burst mode non-volatile memory. The above-mentioned problems of traditional burst mode memories and other problems are addressed by the present invention, at least in part, and will be understood by reading and studying the following specification.

DETAILED DESCRIPTION

Although, various embodiments have been illustrated using particular electronic components it will be understood by those of ordinary skill in the art that other circuit elements could be used to implement the invention and that the present invention is not limited to the arrangement of circuit elements disclosed. Moreover, it will also be understood in the art that the present invention could be applied to a multichannel burst memory circuit for use in devices other than flash memory circuits. Therefore, the present invention is not limited to a multichannel burst memory circuit for a flash memory.

Figure 1:
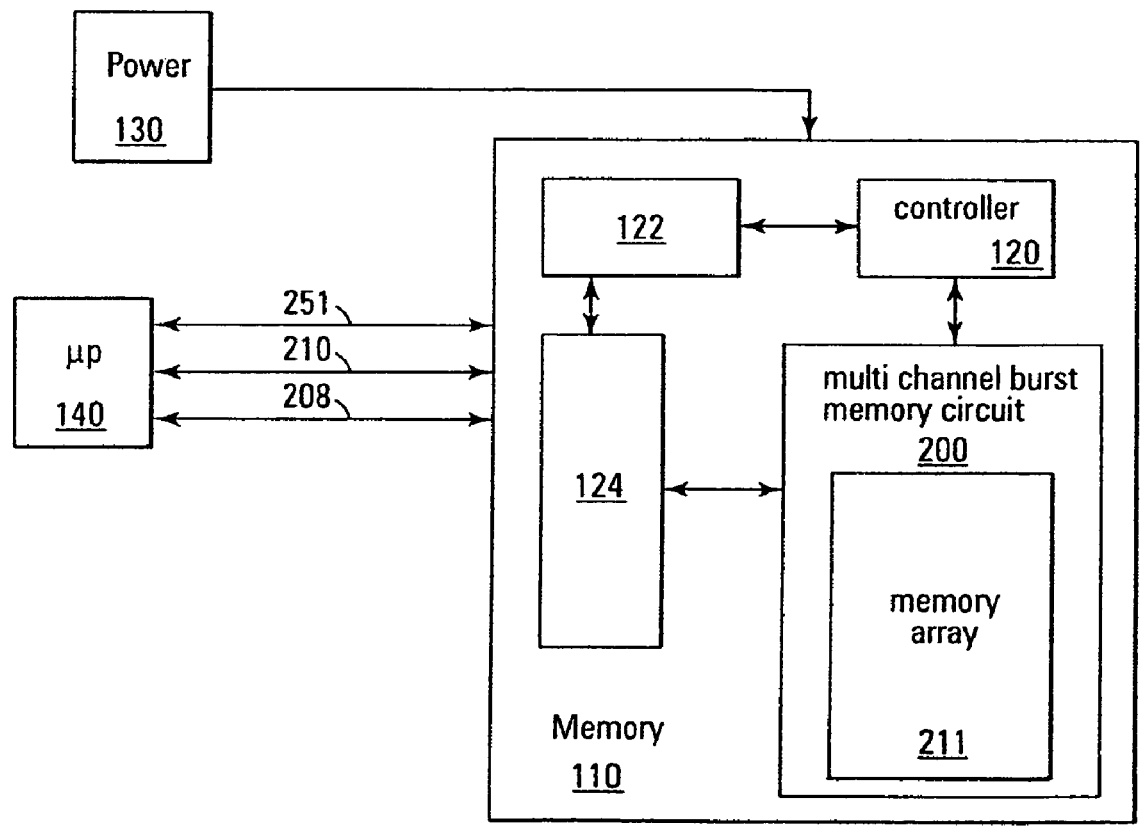
FIG. 1 is a block diagram of a memory circuit coupled to a processor according to an example of the invention.

FIG. 1 shows a computer system 100 including a memory 110, a power supply 130 and a processor 140. Memory 110 includes a memory array 112 of nonvolatile memory cells (which can be flash memory cells), a controller 120 that controls detailed operations of memory 110 such as the various individual steps necessary for carrying out writing, reading, and erasing operations according to control signals provided by processor 140 on control signal bus 251, an address decoder circuit 122 for decoding and selecting addresses provided by processor 140 on address bus 208 to access appropriate memory cells in memory array 211, and I/O circuits 124 for providing bi-directional communications between processor 140 and memory circuit 110 over data bus 210. Memory circuit 110 also includes components related to multichannel burst memory circuit 200, in general containing the memory array 211, described in detail below. In general, processor 140 interacts with memory 110 by providing external addresses for memory accesses to memory 110. Processor 140 also provides signals and/or instructions calling for a mode of addressing the memory such as fixed or continuous burst mode. The system processor 140 interacts with memory 110 throughout the control signals bus 251, that includes signals ce# (chip enable), clk (system clock), adv# (address valid), we# (write enable), oe# (output enable) and cs# (channel select). The interface protocol is generally the same protocol used in systems based on standard flash memories, the only differences being related to the cs# control signal, specifically introduced for the purposes of the invention. Those differences will be clear to those skilled in the art by reading the following specification.

Figure 2:
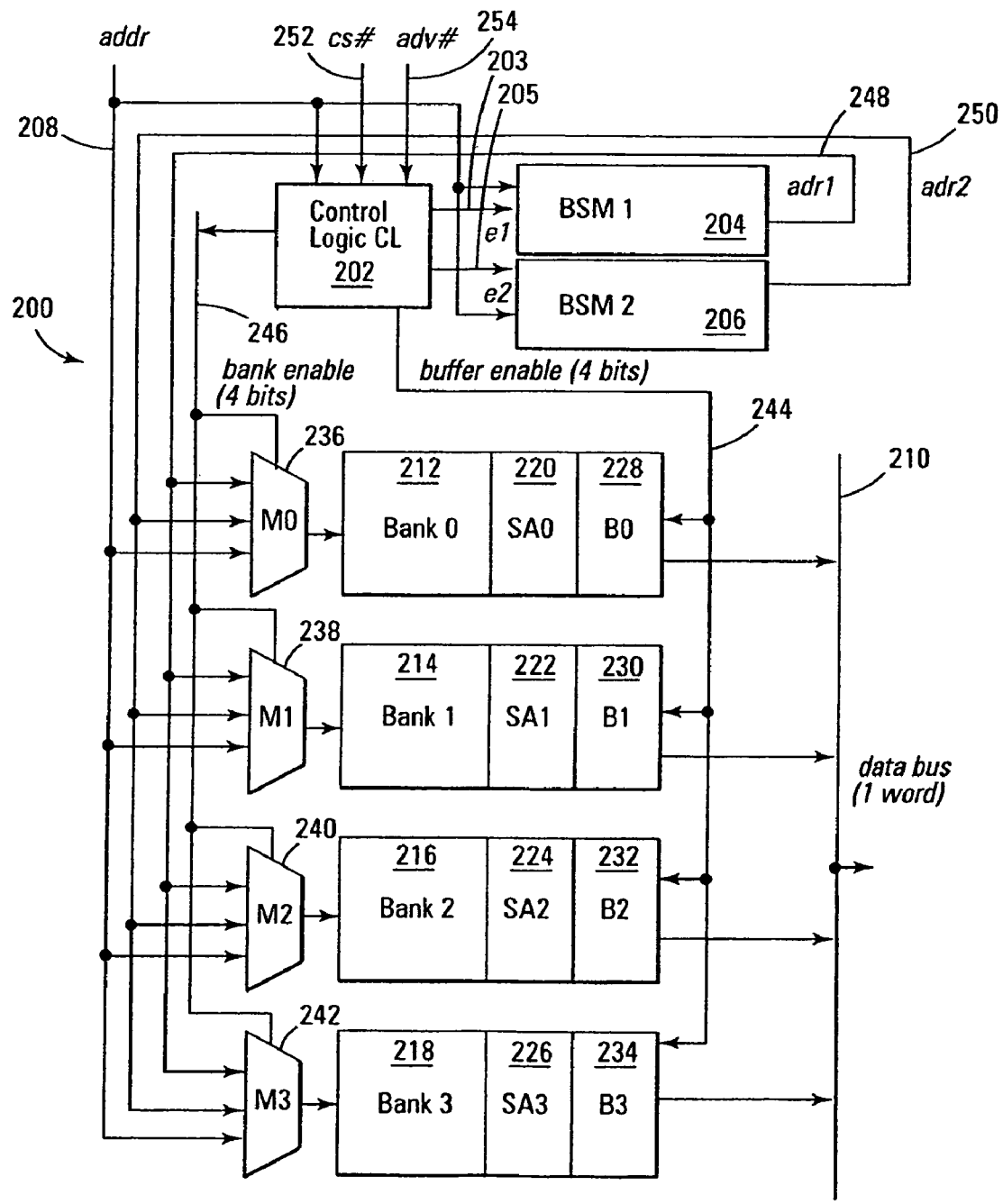
FIG. 2 is a block diagram of a multichannel burst memory circuit according to an example of the invention.

FIG. 2 shows a simplified block diagram of a multichannel burst memory circuit 200 having a multichannel burst mode capability, according to one example of the invention. The circuit may include memory banks 212, 214, 216 and 218 (banks 0-3), that are in general, but not necessarily, partitions of the memory array 211, with sense amplifiers 220, 222, 224 and 226 and memory buffers 228, 230, 232 and 234. Data read from each bank may be sensed by the sense amplifier associated with that bank and loaded into the respective buffers. Memory buffers 228, 230, 232 and 234 feed data to data bus 210 connected to input/output circuits 124 and to the external world, such as processor 140.

Multiplexers 236, 238, 240 and 242 (or other selection circuits) associated with each memory bank each control addressing of their respective memory banks. Two burst state machines (BSMs) 204 and 206 are shown each of which are capable of managing a data channel, i.e., a stream of consistent data. Additional BSMs may be employed to handle additional data channels. Control logic block 202 supervises operation of the multichannel burst memory circuit 200.

Memory circuit 200 operates, in general, as follows. In this example, for purposes of illustration, a burst length of 4 words for fixed length burst mode will be discussed. Other burst lengths may, of course, be used. In addition to fixed length burst mode, a memory chip and its burst machine may also be capable of operating in continuous burst mode, i.e., managing a continuous burst read from one bank, sending the data on the data bus while at the same time retrieving data at the next address from the same memory bank and continuously fetching data and loading the buffer with data. Circuits associated with memory 200 are clocked by a clock signal clk (shown in the timing diagram of FIG. 3 but not otherwise illustrated).

Before starting the operation of multichannel burst memory circuit 200, the chip is configured which may include defining the modes of burst operations. While dynamic management of the assignment of the burst modes is also possible, in this example, burst modes are assumed to be assigned to the BSMs during chip configuration. There are 4 possible cases:

| 1. | BSM 204 | Fixed | BSM 206 | Fixed |
| 2. | BSM 204 | Fixed | BSM 206 | Continuous |
| 3. | BSM 204 | Continuous | BSM 206 | Fixed |
| 4. | BSM 204 | Continuous | BSM 206 | Continuous |

These burst mode assignments may be stored in control logic block 202 before starting operation.

Case 3 illustrates operation of the invention. Operation of the present invention in other cases will be apparent to those of ordinary skill in the art from the discussion of case 3, below. Case 3 involves two data streams, one operating in fixed burst mode, and the other operating in continuous burst mode. In this example, the channel controlled by BSM 204 is used for a continuous stream of data, while the channel controlled by BSM 206 is used for 4 word fixed bursts. The burst state machines may be configured for fixed or continuous mode operation before memory read operations are initiated, or may be changed dynamically during a read operation, as will be explained in more detail below.

Channel select signal 252 (cs#) is used to select the burst channel. It is provided by an external user such as microprocessor 140. In the example of the present invention, when channel select signal 252 is at "1" the selected channel is the one managed by BSM 204, so that the burst mode is continuous; while channel select signal 252 at "0" means that the selected channel is the one managed by BSM 206, so that the burst mode is fixed. Burst modes are asserted by control logic 202 as the external address on address bus 208 is asserted, i.e., at the first rising edge of the clock clk when address valid signal 254 (adv#) is at "0"

Figure 3:
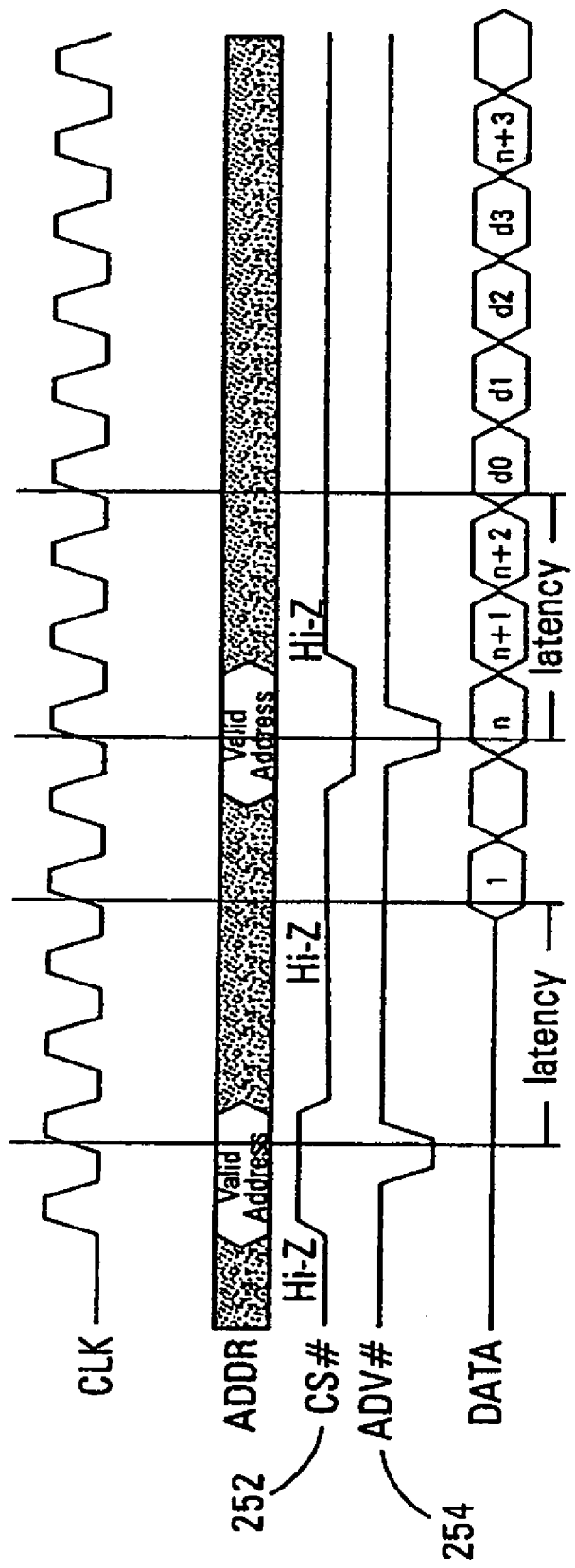
FIG. 3 is a timing diagram showing operation of a memory circuit according to an example of the invention.

FIG. 3 shows a timing diagram of the operation of multichannel burst memory circuit 200. Signals shown are the clock clk, addresses on address bus 208, channel select signal 252, address valid signal 254 and data on data bus 210. Latency is the time needed to get data from the first rising edge of the clock when address valid signal 254 is "0" to the time the data is valid on data bus 210. In general, the latency of a memory circuit is a predefined electrical parameter that is a function of the memory speed and of the clock frequency. In this example, the latency is assumed to be 3 clock cycles.

Initially, buffers 228, 230, 232 and 234 are disabled by buffer enable signals 244 from control logic 202. Therefore, the tri-state outputs of buffers 228, 230, 232 and 234 are at high impedance. Memory banks 212, 214, 216 and 218 are identified by the two most significant bits (MSB) on address bus 208.

At the first rising edge of the clock clk inside address valid signal 254 at "0", control logic 202 reads channel select signal 252 and, if the signal is at "1", control logic 202 recognizes that BSM 204 is selected and that a continuous burst is needed. From the two most significant bytes (MSBs) on address bus 208, control logic 202 determines from which of the 4 banks the burst will start, and provides buffer enable signals 244 to the appropriate buffers and associated multiplexers using bank enable 246 and buffer enable 244 signals. For example, if the two MSBs of addr are '10' binary, the selected bank will be bank 216 and multiplexer 240 and buffer 232 will also be enabled. Control logic 202 will also enable BSM 204 (configured in case 3 to run in continuous mode) by enable signals 203 and 205. The number of individual signal lines making up signals 203 and 205 will depend on the details of the actual implementation not necessary in order to convey understanding of the present invention.

After the latency period has passed, the data stream coming out of bank 216 is present on data bus 210. The next addresses for the burst operation are provided by BSM 204 on burst address lines 248 via enabled multiplexer 240. BSM 204 feeds subsequent addresses to memory bank 216 in order to keep a continuous stream of data on data bus 210, managing the data flow from memory bank 216 to buffer 232 through the bank of sense amplifiers 224. The system will also continue automatically to the next bank if a burst read continues beyond the address space of bank 216.

If a fixed length burst is needed starting at a new address, at the first rising edge of the clock when the next address valid signal 254 is at "0," channel select signal 252 will also be at "0," selecting BSM 206 which in this case is configured for a fixed length burst. Control logic 202 enables BSM 206 using enable signals 205, and fixed mode is asserted. The two MSBs on address bus 208 may also point to a new memory bank. For example, if the two MSBs on the address bus 208 are now '00' binary, the bank selected will now be bank 212. Control logic 202 enables multiplexer 236 using the bank enable signals 246, allowing the addresses sent by BSM 206 on burst address lines 250 to enter bank 212 thus fetching new data.

The control logic 202 is programmed to know that the latency is, for example, 3 clock cycles. Therefore control logic 202 will wait for 3 clock cycles before disabling buffer 232 and enabling buffer 228 by means of buffer enable 244. This way 3 words of the continuous burst (n, n+1 and n+2 of FIG. 3) are sent from buffer 232 to data bus 210 before the 4 words of the new burst data stream (d0, d1, d2 and d3) are loaded on data bus 210. Simultaneously, control logic 202 holds (without resetting) BSM 204 using enable signals 203 and disables multiplexer 240 using bank enable signals 246.

The burst of 4 words from bank 212 is sent to data bus 210. Once that operation is completed, if a change in burst mode is not called for, control logic, control logic 202 disables buffer 228 and enables buffer 232 using buffer enable 244, switches off BSM 206 using enable signals 205, and disables multiplexer 236 using bank enable 246. In addition, control logic 202 enables BSM 204, which was previously put on hold, using enable signals 203, and again enables multiplexer 240 by bank enable 246. BSM 204 will then restart its operation from where it was held and the continuous burst read will resume controlled by BSM 204 so that no hole is present on data bus 210. As shown in FIG. 3, words d0, d1, d2 and d3 are loaded on data bus 210, then continuous burst resumes with n+3, n+4, and so on. As can be seen from the foregoing example, latency time has been masked to the outside world by the memory circuit of the present invention.

Control logic 202 is designed to manage different sequences of channel select or BSM assignments. For example, the following sequences of modes are possible:
a. continuous followed by fixed (cases 2 or 3 above)
b. continuous followed by continuous (case 4 above, i.e., both BSMs assigned to continuous mode)
c. fixed followed by continuous (cases 2 or 3 above)
d. fixed followed by fixed (case 1 above, i.e., both BSMs assigned to fixed mode)

Mode sequence a is the case described above in detail.

In mode sequence b, when continuous mode is asserted after continuous mode, the first burst data stream is not resumed automatically, since the second burst data stream is continuous, too (i.e., the second data stream does not have a defined end). Eventually, the first data stream can be resumed by the user by addressing it again with the proper channel select value. No latency is paid in this scenario.

For mode sequence c, BSM 206 (channel select 252 set to "0") is activated first. When continuous mode is asserted after fixed, control logic 202 switches on BSM 204 and turns off BSM 206. Control logic 202 also manages bank enable signal 246 and buffer enable signals 244 in order to mask the latency as has been shown above with respect to case 3. Latency masking might be only partial if the remaining data to be read in the fixed data stream takes less time to read than the latency itself (e.g. only 2 data words left in the fixed length data stream and 3 clock cycles of latency). It is also possible that a full latency must be paid if the first fixed data stream was already completed.

For mode sequence d, when fixed mode is asserted after fixed mode, the second fixed data stream is enabled with the same rules as in mode sequence c. No latency or a partial or a full latency will be paid according to the relationship between the activation of the second data stream and the number or byte/words still to be read from the first one. A latency is paid when the same BSM has to start again from a new address. In theory, this situation can always be avoided by the user in mode sequences b and d above, since both channels have the same burst characteristics (both fixed or both continuous), while in mode sequences a and c, the need for two fixed accesses in a row or for two continuous accesses in a row, might require the user to activate the same BSM twice in sequence.

Even if activation of the same burst mode twice in a row is required, it is possible to avoid the loss of latency, or to pay only a partial latency, if the BSMs may be dynamically assigned to fixed or continuous modes by control logic 202. For example, if a new mode is dynamically assigned to the next available BSM, in mode sequences a and c above, it will avoid having to wait for a BSM that is configured for the proper mode. In other words, the control logic 202 may alternate enabling of BSM 204 and BSM 206 to whatever the logic value ("0" or "1") of channel select 252 may be. Additionally, when control logic 202 activates one of the two BSMs it will configure that BSM in the proper mode (i.e., fixed mode with the proper amount of data or continuous mode). For example, for mode sequence 3 (in which BSM 204 is set to continuous mode and BSM 206 is set to fixed mode), and channel select 252 has a logic value of "1" twice in a row, BSM 204 will be activated first and BSM 206 will be activated second, both in continuous burst mode. In that way, since it never happens that the same BSM is enabled twice in a row in subsequent channel select assertions, the burst read proceeds without losing any latency with the (partial) exception of two fixed accesses in a row if, as described above, the remaining data to be read from the 1st data stream takes less time than the latency itself.

All the above discussion is valid if the two data stream starting addresses point to different memory banks. If the same memory bank is addressed, the latency rules are more restrictive. Regardless of whether the data stream to be interrupted is a fixed mode or a continuous mode type, a full latency is paid if the new address points to the same bank and the associated buffer sending data from the previous address happens to be empty. In this case, nothing is available to be sent to data bus 210 until the bank executes the new address and puts the new data into its buffer. Of course, a partial latency only will be paid, if the associated buffer is not completely empty and some data are still available.

What is claimed is:

1. A memory device, comprising:
an array of memory cells;
a first address control circuit for providing a predetermined pattern of addresses for accessing the array in response to a first starting address;eceived from an external device;
a second address control circuit for providing a predetermined pattern of addresses for accessing the array in response to a second starting address received from an external device;
wherein receipt of the second starting address by the second address control circuit while the first address control circuit is providing its pattern of addresses results in an interruption of the pattern of addresses from the first address control circuit within a latency of the memory device after the second address control circuit receives the second starting address.

2. The memory device of claim 1, wherein the first address control circuit, following interruption of its pattern of addresses in response to the second address control circuit receiving the second starting address, is adapted to resume its pattern of addresses after the second address control circuit completes its pattern of addresses.

3. The memory device of claim 1, wherein receipt of a subsequent starting address by the first address control circuit while the second address control circuit is providing its pattern of addresses results in an interruption of the pattern of addresses from the second address control circuit within the predetermined period of time after the first address control circuit receives the subsequent starting address.

4. The memory device of claim 1, wherein the predetermined pattern of addresses of the first address control circuit and/or the second address control circuit are selected from the group consisting of ascending, descending, aligned and linear patterns.

5. The memory device of claim 4, wherein the predetermined pattern of addresses of the first address control circuit and/or the second address control circuit are either fixed length or continuous.

6. The memory device of claim 1, further comprising:
at least two partitions of the array, each associated with a multiplexer for selecting to receive addresses from one of the first and second address control circuits;
wherein the multiplexers are adapted to permit the first and second address control circuits to each provide their patterns of addresses to only one of the partitions; and
wherein the multiplexers are adapted to permit the first address control circuit to provide its pattern of addresses to one of the partitions of the array while the second address control circuit is permitted to provide its pattern of addresses to another partition of the array concurrently.

7. A method of burst memory access of a memory device, comprising:
accessing a first memory bank of the memory device using a first burst mode;
interrupting the first burst mode to access a second memory bank of the memory device using a second burst mode; and
resuming the first burst mode accessing of the first memory bank after completion of the second burst mode accessing of the second memory bank.

8. The method of claim 7, further comprising:
beginning to load data from the first memory bank to a data bus a predetermined time after beginning to access the first memory bank using the first burst mode.

9. The method of claim 8, further comprising:
continuing to load data from the first memory bank to the data bus after interrupting the first burst mode.

10. The method of claim 9, further comprising:
beginning to load data from the second memory bank to the data bus the predetermined time after beginning to access the second memory bank using the second burst mode and, concurrently, halting loading of data from the first memory bank to the data bus.

11. The method of claim 10, further comprising:
resuming loading of data from the first memory bank to the data bus upon completing loading of data from the second memory bank to the data bus.

12. The method of claim 7, wherein the first and second burst modes are independently configurable.

13. The method of claim 7, wherein the first and second burst modes are dynamically configurable during operation of the memory device.

14. The method of claim 7, wherein the first and second burst modes comprise generating patterns of addresses selected from the group consisting of ascending, descending, aligned and linear patterns.

15. The method of claim 14, wherein the patterns of addresses are either fixed length or continuous.

16. A computer system, comprising:
a processor; and
a memory device coupled to the processor, the memory device comprising:
an array of memory cells;
first and second address control circuits; and
buffer circuits to store data retrieved from the array;
wherein the first address control circuit is adapted to generate a first array address sequence and the second address control circuit is adapted to generate a second array address sequence;
wherein the first and second address control circuits are adapted to permit concurrent generation of the first and second array address sequences; and
wherein the second address control circuit is adapted to permit generation of the second array address sequence using a starting address independent of a starting address used to generate the first array address sequence.

17. The computer system of claim 16, further comprising control logic to control the buffer circuitry such that a first output operation responding to the first address control circuit is not interrupted until data is available from the second array address sequence.

18. A computer system, comprising:
a processor; and
a memory device coupled to the processor, the memory device comprising:
an array of memory cells comprising $x_0$ to $x_n$ banks;
first and second address control circuits;
buffer circuits to store data retrieved from the array, the buffer circuits comprising $b_0$-$b_n$ buffers; and
control logic to control the buffer circuitry;
wherein the first address control circuit is adapted to generate a first array address sequence and the second address control circuit is adapted to generate a second array address sequence;
wherein the first and second address control circuits are adapted to permit concurrent generation of the first and second array address sequences;
wherein the control logic is adapted to provide that a first output operation responding to the first address control circuit is not interrupted until data is available from the second array address sequence; and
wherein the control logic enables buffers $b_0$-$b_{n-1}$ to output data from the first array address sequence while data from the second array address sequence is loaded into buffer $b_n$.

19. A computer system, comprising:
a processor; and
a memory device coupled to the processor, the memory device comprising:
a plurality of memory banks;
a plurality of memory buffers to hold data accessed from the plurality of memory banks;
a plurality of selection circuits operatively connected to an external address bus to provide selective addressing of the memory banks;
a plurality of burst address state machines each providing a predetermined pattern of addresses to the plurality of selection circuits; and
control logic to supervise operation of the plurality of burst address state machines, memory buffers, and selection circuits wherein the predetermined pattern of addresses provided by one of the plurality of burst address state machines is followed by a predetermined pattern of addresses provided by another of the plurality of burst address state machines such that latency is minimized.

20. The computer system of claim 19, wherein the burst address state machines selectively operate in fixed mode or continuous mode.

21. The computer system of claim 19, wherein each one of the plurality of burst address state machines manage addressing of data from a data channel.

22. The computer system of claim 19, wherein the control logic selectively asserts burst modes for the plurality of burst address state machines in response signals comprising address signals on the external address bus.

23. The computer system of claim 22, wherein the control logic selectively asserts burst modes for the plurality of burst address state machines in response signals comprising a channel select signal.

24. The computer system of claim 23, wherein the control logic selectively asserts burst modes for the plurality of burst address state machines in response signals comprising an address valid signal.

25. The computer system of claim 19, wherein the control logic waits a predetermined latency period before enabling the memory buffers.

26. The computer system of claim 19, wherein the memory banks may be identified by one or more bits on the external address line.

27. The computer system of claim 19, wherein the memory banks are accessed by a plurality of sense amplifiers.

28. A computer system, comprising:
a processor; and
a memory device coupled to the processor, the memory device comprising:
  a first burst address state machine;
  a second burst address state machine;
  a plurality of memory banks;
  a plurality of sense amplifiers for accessing data from the plurality of memory banks;
  a plurality of memory buffers to hold data accessed from the plurality of memory banks;
  a plurality of selection circuits for selectively addressing data in the plurality of memory banks;
  control logic to supervise operation of the plurality of burst address state machines, memory buffers, and selection circuits;
an external address bus; and
a data bus selectively coupled to the plurality of memory buffers by the control logic wherein a first burst state machine operation is followed by a second burst state machine operation such that latency on the data bus is minimized.

* * * * *

UNITED STATES PATENT AND TRADEMARK OFFICE
CERTIFICATE OF CORRECTION

PATENT NO. : 7,363,452 B2  Page 1 of 1
APPLICATION NO. : 11/343818
DATED : April 22, 2008
INVENTOR(S) : Imondi et al.

It is certified that error appears in the above-identified patent and that said Letters Patent is hereby corrected as shown below:

In column 6, line 46, in Claim 1, delete "address;eceived" and insert
-- address received --, therefor.

Signed and Sealed this

First Day of July, 2008

JON W. DUDAS
*Director of the United States Patent and Trademark Office*